United States Patent
Liu et al.

(10) Patent No.: US 6,309,922 B1
(45) Date of Patent: Oct. 30, 2001

(54) METHOD FOR FABRICATION OF ON-CHIP INDUCTORS AND RELATED STRUCTURE

(75) Inventors: Q. Z. Liu; Bin Zhao; David Howard, all of Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 126 days.

(21) Appl. No.: 09/627,505

(22) Filed: Jul. 28, 2000

(51) Int. Cl.[7] ............................................... H01L 21/8234
(52) U.S. Cl. .......................... 438/238; 438/381; 438/783
(58) Field of Search .................................... 438/238, 381, 438/130, 619, 766, 783

(56) References Cited

U.S. PATENT DOCUMENTS 5,652,173 * 7/1997 Kim .
5,770,509 * 6/1998 Yu et al. ............................... 438/381

* cited by examiner

Primary Examiner—Jey Tsai

(74) Attorney, Agent, or Firm—Farjami & Farjami LLP

(57) ABSTRACT

Method for fabrication of on-chip inductors and related structure are disclosed. According to one embodiment, inductors are formed by patterning conductors within a certain dielectric layer in a semiconductor die. Thereafter, the entire dielectric layer in the semiconductor die is subjected to a blanket implantation or sputtering of high permeability material. According to another embodiment, a first area in a semiconductor die is covered, for example, with photoresist. A second area in the semiconductor die includes a patterned conductor which is to be used as an inductor. The patterned conductor is also covered, for example, with photoresist. The second area, excluding the covered patterned conductor is subjected to implantation or sputtering of high permeability material. According to yet another embodiment, a first area of a semiconductor die is covered, for example, with photoresist. A second area in the semiconductor area includes a patterned conductor which is to be used as an inductor. This second area, including the patterned conductor, is subjected to implantation or sputtering of high permeability material. The implantation or sputtering of high permeability materials result in the inductors having much higher inductance values than they would otherwise have.

23 Claims, 3 Drawing Sheets

METHOD FOR FABRICATION OF ON-CHIP INDUCTORS AND RELATED STRUCTURE

BACKGROUND OF THE INVENTION

1. Field of the Invention

The present invention is generally in the field of semiconductor chips. In particular, the present invention is in the field of inductors used in semiconductor chips.

2. Background Art

FIG. 1 shows a top view of a conventional inductor 100 on an area of a semiconductor chip. The square configuration of the inductor shown in FIG. 1 is commonly used on semiconductor chips and is referred to as a "square spiral inductor."

The 4 metal turns of inductor 100 are referred to by numerals 104, 106, 108, and 110. Metal turns 104, 106, 108, and 110 are patterned within dielectric 102 in a manner known in the art. Thus, the areas of dielectric 102 which are flanked by metal turns 104, 106, 108, and 110 are within the electromagnetic field that will be created by metal turns 104, 106, 108, and 110. Dielectric 102 is silicon dioxide while metal turns 104, 106, 108, and 110 are aluminum or copper.

Metal turns 104, 106, 108, and 110 are patterned on one metal layer. Metal turn 110 comprises connection terminal 112. Connection terminal 112 is thus a part of inductor 100 while also functioning as a first connection terminal of inductor 100. Connection terminal 114 is also a part of inductor 100 and functions as a second connection terminal of inductor 100. However, connection terminal 114 is patterned on a different metal layer of the chip than the rest of inductor 100 to allow connection terminal 114 to cross underneath or above metal turns 104, 106, 108 and 110 of inductor 100 without shorting the metal turns together. An electrical connection between connection terminal 114 and the remainder of the metal used to fabricate metal turns 104, 106, 108, and 110 of inductor 100 is then provided by a via. Connection terminal 114 is shown in a different shade to show that it is situated on a different metal layer of the chip than the remainder of the metal used to fabricate inductor 100. The width of inductor 100 is referred to by numeral 116.

The inductance value of a square spiral inductor, such as inductor 100, is determined by the empirical equation:

$$L = 0.38\mu_0 n^2 d \quad \text{(Equation 1)}$$

where L is the net effective inductance, $\mu_0$ is the permeability of free space ($\mu_0 = 4\pi(10^{-13})$ henrys/$\mu$m), n is the number of metal turns, d is the "spiral diameter" which is a term used to refer to width 116 of inductor 100, and 0.38 is a coefficient which is derived from the shape of the inductor.

As an example, if a circuit on a semiconductor chip required a square spiral inductor with a value of 30 nano-henrys and a pitch of one turn per 5.0 microns, the inductor would require 17 metal turns and would have a spiral diameter of 217 microns.

On-chip inductors can be used in mixed signal circuits and in RF applications such as receiver chips in wireless telephone technologies. Typical inductor values for a square spiral inductor used in such applications range from 1 to 100 nano-henrys. It can be seen from the above example that to achieve these desired values of inductance, a very large area of the chip has to be set aside for the inductor. In fact, these inductors tend to dominate the chip, leaving less area for other circuit elements. Thus, the inductor's size limits the use of on-chip inductors for RF and mixed signal circuits.

As can be seen from Equation 1, device engineers can achieve a higher inductance value by increasing the number of metal turns of the inductor. However, as the number of metal turns increases, the overall resistance of the metal turns will also increase due to the increasing length of the metal turns. The increased resistance of the metal turns results in a lower quality factor ("Q"), since the quality factor is determined by Q=L/R, where L is the inductance and R is the resistance inherent in the inductor. For a given inductance, as the resistance increases, the quality factor decreases.

Alternatively, the inductance can be increased by increasing the spiral diameter of the on-chip inductor. However, this would make the on-chip inductor even larger and would require more chip space. As explained above, square spiral inductors already dominate the chip. Therefore, there is little available space on the chip for even larger inductors.

Thus, it is seen that there are problems associated with both of the above described methods for increasing the inductance of a square spiral inductor. Either the size of the inductor will increase further by increasing the spiral diameter of the inductor, or the quality factor will go down as a result of an increased number of metal turns within a given spiral diameter of the inductor.

As a result of these problems, device engineers have been trying to achieve a higher inductance without an increase in the space occupied by the inductor on the chip and without a decrease in the quality factor of the inductor. Thus, variations in the layout of the on-chip inductor have been made to optimize the inductance value and quality factor of the inductor.

One such variation is the "hollow spiral inductor." This on-chip inductor is similar to the square spiral inductor except that some of the metal turns at the center of the inductor are removed while the outer metal turns remain. The missing center metal turns result in lower overall resistance of the inductor and therefore a higher quality factor. Thus, by using a hollow spiral inductor instead of a square spiral inductor, a higher quality factor can be achieved for an on-chip inductor with a given spiral diameter and a given number of metal turns.

The inductance of a hollow spiral inductor is determined by the empirical equation:

$$L = (37.5\mu_0 n^2 a^2)/(11d - 14a) \quad \text{(Equation 2)}$$

where L is the net effective inductance, $\mu_0$ is the permeability of free space ($\mu_0 = 4\pi(10^{-13})$ henrys/$\mu$m), n is the number of metal turns, d is the "spiral diameter" which is substantially the same as the width of the hollow spiral inductor, a is the "spiral radius" which is arrived at by empirical calculations and is equal to or slightly less than one half of the value of the spiral diameter d, and 37.5 is a coefficient that has been determined empirically.

Similarly, other variations in the layout of on-chip inductors have been used to reduce the size of the on-chip inductor while maintaining a high inductance. However, the reduction in the size of on-chip inductors that has been achieved by these variations in the layout of the inductor has been outpaced by the continuing "scaling down" of the chip size over time. Thus, the continuing trend towards smaller chips has resulted in a need for even smaller on-chip inductors.

Another shortcoming with known inductors, such as inductor 100, is that when for various reasons it is permissible to have a smaller inductance, a "scaled down" value of inductance cannot be easily achieved by reducing the number of turns n. The reason is that when the number of turns n decreases, the inductance decreases in proportion to a decrease in the value of n². This decrease in the value of inductance is desirable, but it is always accompanied by a degradation in the quality factor Q. The reason is that a reduction in the number of turns n causes a reduction in the value of the resistance R inherent in the inductor in linear proportion to n. As such, the quality factor Q which is given by L/R, is also reduced by a factor of n. This decrease in quality factor Q is undesirable and is a result of an attempt to reduce the value of the inductance L by simply reducing the number of turns n.

Thus, there is a serious need in the art for an on-chip inductor that occupies a smaller space on the semiconductor chip, while having at the same time a high value of inductance and a high quality factor.

SUMMARY OF THE INVENTION

The present invention is method for fabrication of on-chip inductors and related structure. The invention overcomes a serious need in the art for an on-chip inductor that occupies a small space on the semiconductor chip, while at the same time has a high inductance value and a high quality factor.

According to one embodiment of the invention, inductors are formed by patterning conductors within a certain dielectric layer in a semiconductor die. Thereafter, the entire layer of dielectric and conductors in the semiconductor die are subjected to a blanket implantation or sputtering of high permeability material. The implantation or sputtering of high permeability material results in the inductors within the dielectric layer to have much higher inductance values than they would otherwise have.

According to another embodiment of the invention, a first area in a semiconductor die is covered, for example, with photoresist. A second area in the semiconductor die includes a patterned conductor which is to be used as an inductor. The patterned conductor is also covered, for example, with photoresist. The second area, excluding the covered patterned conductor, is subjected to implantation or sputtering of high permeability material. The implantation or sputtering of high permeability material results in the inductor having a much higher inductance value than would otherwise be achievable.

According to yet another embodiment of the invention, a first area of a semiconductor die is covered, for example, with photoresist. A second area in the semiconductor area includes a patterned conductor which is to be used as an inductor. This second area, including the patterned conductor, is subjected to implantation or sputtering of high permeability material. The implantation or sputtering of high permeability material results in the inductor having a much higher inductance value than it would otherwise have.

DETAILED DESCRIPTION OF THE INVENTION

The present invention is method for fabrication of on-chip inductors and related structure. The following description contains specific information pertaining to different types of materials, layouts, dimensions, and implementations of the invention's inductor. One skilled in the art will recognize that the present invention may be practiced with material, layout, or dimensions different from those specifically discussed in the present application. Moreover, some of the specific details of the invention are not discussed in order to not obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 2A:
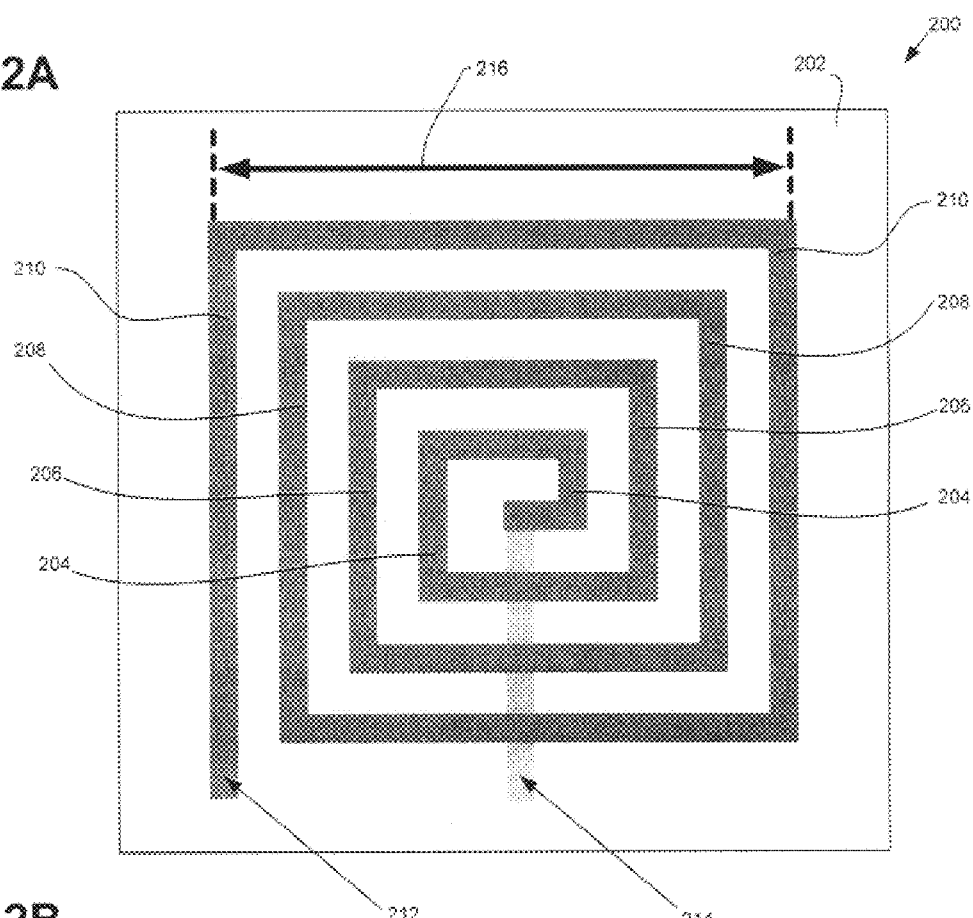
FIG. 2A illustrates a top view of the invention's inductor.

FIG. 2A shows a top view of the invention's inductor 200 in an area of a semiconductor chip. In this example, the inductor is configured as a "square spiral inductor." The 4 metal turns of inductor 200 are referred to by numerals 204, 206, 208, and 210. Metal turns 204, 206, 208, and 210 are patterned within dielectric 202 in a manner known in the art. Thus, the areas of dielectric 202 which are flanked by metal turns 204, 206, 208, and 210 are within the magnetic field that will be created by metal turns 204, 206, 208, and 210. Dielectric 202 can be silicon dioxide or low-k dielectrics. Metal turns 204, 206, 208, and 210 can be aluminum, copper, or a copper-aluminum alloy.

Metal turns 204, 206, 208, and 210 are patterned on one metal layer. Metal turn 210 comprises connection terminal 212. Connection terminal 212 is thus a part of inductor 200 while also functioning as a first connection terminal of inductor 200. Connection terminal 214 is also a part of inductor 200 and functions as a second connection terminal of inductor 200. However, connection terminal 214 is patterned on a different metal layer of the chip than the rest of inductor 200 to allow connection terminal 214 to cross underneath metal turns 204, 206, 208 and 210 of inductor 200 without shorting the metal turns together. An electrical connection between connection terminal 214 and metal turn 204 of inductor 200 is then provided, for example, by means of a via. Connection terminal 214 is shown in a different shade to show that it is situated on a different metal layer of the chip than the remainder of the metal used to fabricate inductor 200. The width of inductor 200 is referred to in FIG. 2A by numeral 216.

By way of background, when a material is placed within the magnetic field of an inductor, the magnetic dipoles of the material interact with the magnetic field created by the inductor. If the magnetic field of the inductor is reinforced by the magnetic moments, a larger number of flux lines are created, thus increasing the inductance. The ability of a material to reinforce the magnetic field of the inductor is determined by the permeability of the material. Permeability is the property of a material which describes the magnetization developed in that material when excited by a magnetic field.

Figure 1:
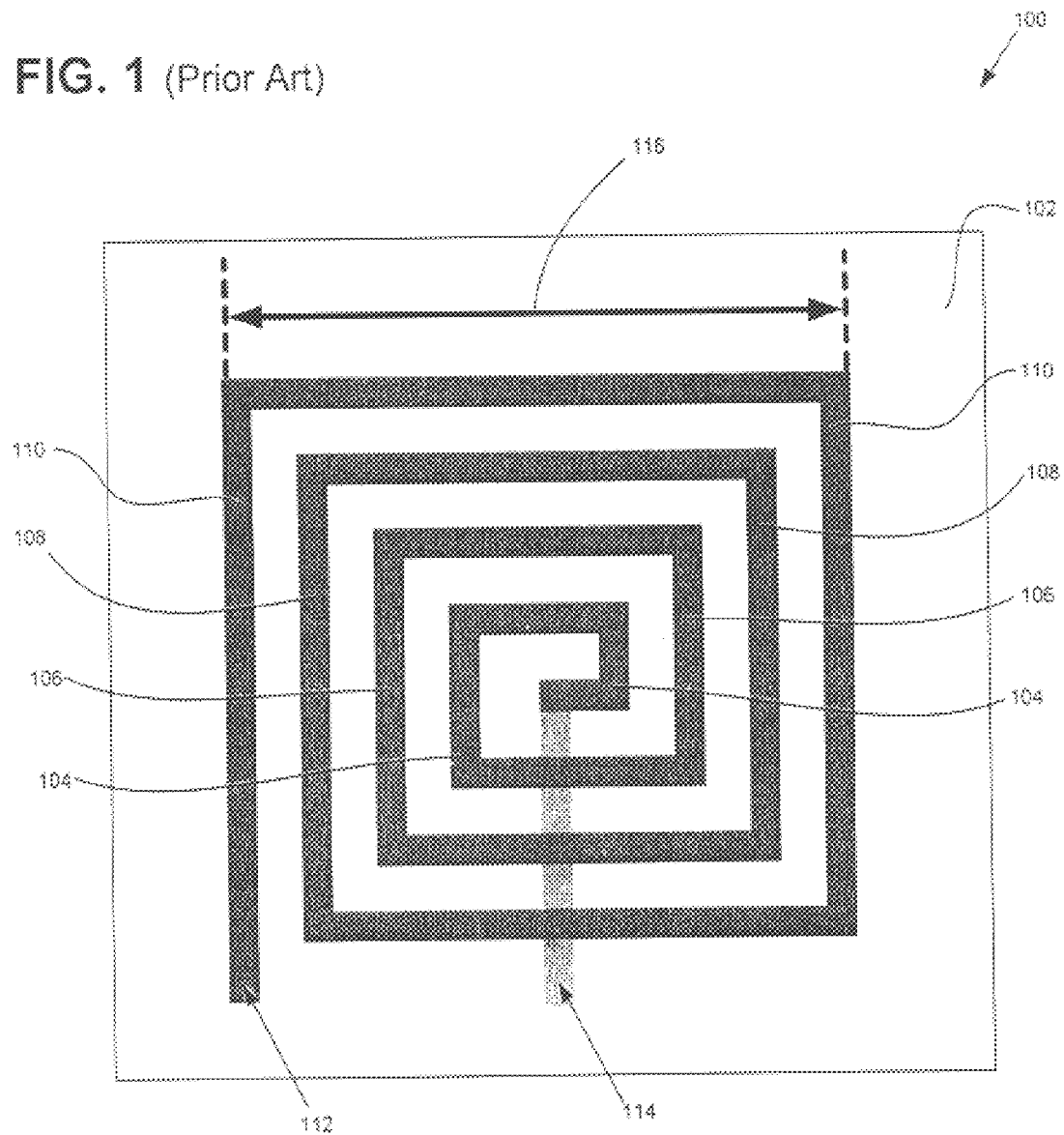
FIG. 1 illustrates a top view of a prior art inductor used in semiconductor chips.

In the discussion of FIG. 1 in the background section of this application the permeability of dielectric 102, which is situated within the magnetic field that will be created by metal turns 104, 106, 108, and 110 of inductor 100, was not included in Equation 1. This was because dielectric 102 was silicon dioxide or low-k dielectrics in the example shown in FIG. 1 and the permeability of silicon dioxide and low-k dielectrics is equal to 1.0. Therefore, the result of Equation 1 would apply to materials, such as silicon dioxide or low-k dielectrics, whose permeability is equal to 1.0.

However, if other materials with higher values of permeability are placed within the magnetic field of the inductor, the net effective inductance of square spiral inductor 200 is calculated by the equation:

$$L = 0.38 \mu_0 \mu n^2 d \quad \text{(Equation 3)}$$

where L is the net effective inductance, $\mu_0$ is the permeability of free space ($\mu_0 = 4\pi(10^{-13})$ henrys/$\mu$m), $\mu$ is the relative permeability of the material used for the dielectric, n is the number of metal turns, d is the "spiral diameter" which is a term used to refer to width 216 of inductor 200, and 0.38 is a coefficient which is derived empirically from the shape of the inductor.

It is seen from Equation 3 that the net effective inductance can be increased by placing a material with a high permeability within the magnetic field of the inductor. There are many classes of materials that have very high permeability. For example, a certain class of metals, including iron and nickel, have relative permeability values in the thousands. Some alloys have even higher relative permeability values, some in the millions. For example, nickel-iron alloys have a much higher permeability than iron alone. In addition, some magnetic oxides also have high values of permeability. These magnetic oxides are usually made of ferrites, i.e. crystalline minerals composed of iron oxide in combination with some other metal. As an example, a type of ferrite magnetic oxide having a spinel structure can be used as a high permeability material. Thus, if a high permeability material, such as one of those specifically mentioned above, is placed within the magnetic field of the inductor, $\mu$ in Equation 3 will be high, resulting in a high inductance value for a given spiral diameter and a given number of metal turns.

The present invention increases the permeability of the dielectric material that will be within the magnetic field of the inductor on a semiconductor chip by introducing into the dielectric material atoms and/or molecules of high permeability materials. These high permeability atoms and/or molecules will increase the permeability of the dielectric material significantly. The high permeability atoms and/or molecules can be introduced into the dielectric material using ion implantation or ion sputtering techniques. The process of implantation, sputtering, or any other process used to introduce high permeability material into the dielectric material which surrounds an inductor is collectively referred to as "interspersing" in the present application. The high permeability material which is interspersed into the dielectric material is also referred to as a "permeability conversion material."

In the present embodiment of the invention, the inductor's metal turns are patterned, in a manner known in the art, into the topmost metal layer of the semiconductor chip, except for connection terminal 214, which is patterned on the next lower metal layer, as discussed above. In one embodiment, the ion implantation or ion sputtering step is performed after inductor 200 is patterned into the topmost metal layer.

Ion implantation can be used to introduce ions of high permeability materials into dielectric 202 of inductor 200. More specifically, a high current ion implanter could be used to ionize and separate individual atoms of the high permeability material, such as iron or nickel, accelerate and form them into a beam which would be swept across the chip surface. The individual ions would penetrate the surface of the chip and come to a stop below the surface of the chip. It is noted that in the present application the term "ions" is used generally to refer to ionized atoms, ionized clusters of atoms, or ionized molecules.

The ion implanter used to implant ions in the chip is a typical ion implanter that is used in many other ion implantation steps required for fabricating semiconductor chips. For example, these ion implanters are used to implant arsenic, boron, and argon ions into the chip to form doped regions on the chip.

As an example of the present invention, iron ions could be implanted in dielectric 202 to increase its permeability. In the alternative, nickel ions or ions from other high permeability metals could be implanted. Further, a metal alloy can be implanted in dielectric 202 by implanting ions of different metals in doses that correspond to the ratio of the different atoms in the alloy and in energies that give matched implantation depth profile. The different ions of the alloy would be implanted during separate implantation steps. This metal alloy implantation may be desirable, as some metal alloys have higher permeability than the individual metals alone.

Figure 2B:
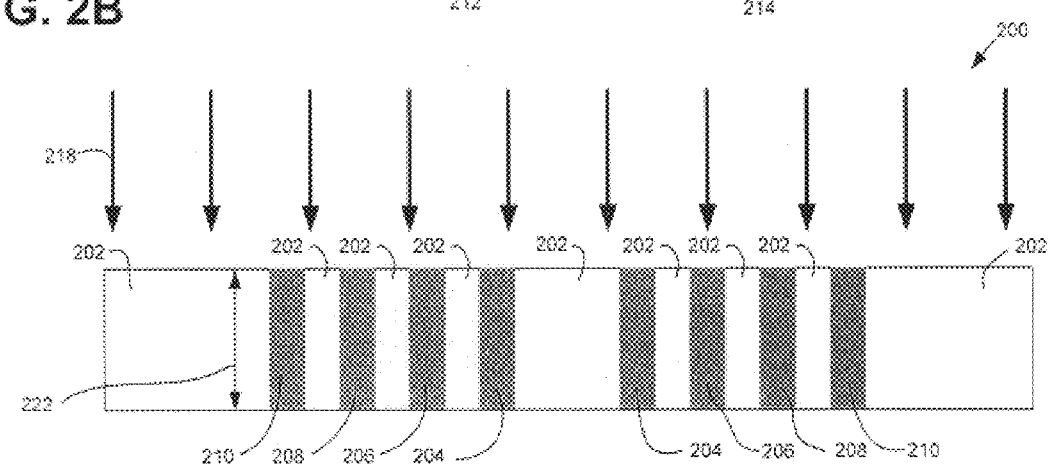
FIG. 2B illustrates a cross section view of the invention's inductor during a blanket ion implantation step.

FIG. 2B shows a cross section of inductor 200 during the ion implantation step. Metal segments 204, 206, 208, and 210 are segments of metal turns 204, 206, 208, and 210, respectively. In one embodiment of the invention, a blanket implant of ions is distributed across the entire chip surface. No masking step is required, which results in a cost saving. In the absence of a mask, ions, referred to generally by numeral 218, will blanket the entire surface of the chip, including dielectric 202 and metal segments 204, 206, 208, and 210.

In the present example, the depth of dielectric 202 and metal segments 204, 206, 208, and 210, referred to by numeral 222, is approximately 3.0 microns. Using a high current implanter, ions 218 will penetrate the surface of the chip to a depth of approximately 5 to 20 percent of the depth of dielectric 202 and metal segments 204, 206, 208, and 210, i.e., to a depth of approximately 0.1 to 0.6 microns.

A post-implant anneal may be required to electrically activate the implanted ions as well as to repair damage to the chip resulting from the surface bombardment of the ions. A typical anneal within a hydrogen atmosphere in a tube furnace will take place at a temperature of between 300 and 1000 degrees Centigrade.

In another embodiment of the invention, a masking step can be used in order to selectively implant ions only in the area of dielectric material between the metal turns of the inductor. The remainder of the chip, including the metal turns of the inductor, are protected by photoresist. By using photoresist to isolate the area of ions penetration to the dielectric areas between the metal turns of the inductor, any undesirable changes in the resistance of the metal turns of the inductor or in other parameters of the remainder of the chip resulting from the implantation of ions is avoided. Thus, the permeability of the selected area of dielectric material will be increased while the permeability of the remaining unselected areas of the chip will remain unchanged. This embodiment of the invention is discussed below in relation to FIG. 3A and FIG. 3B.

Figure 3A:
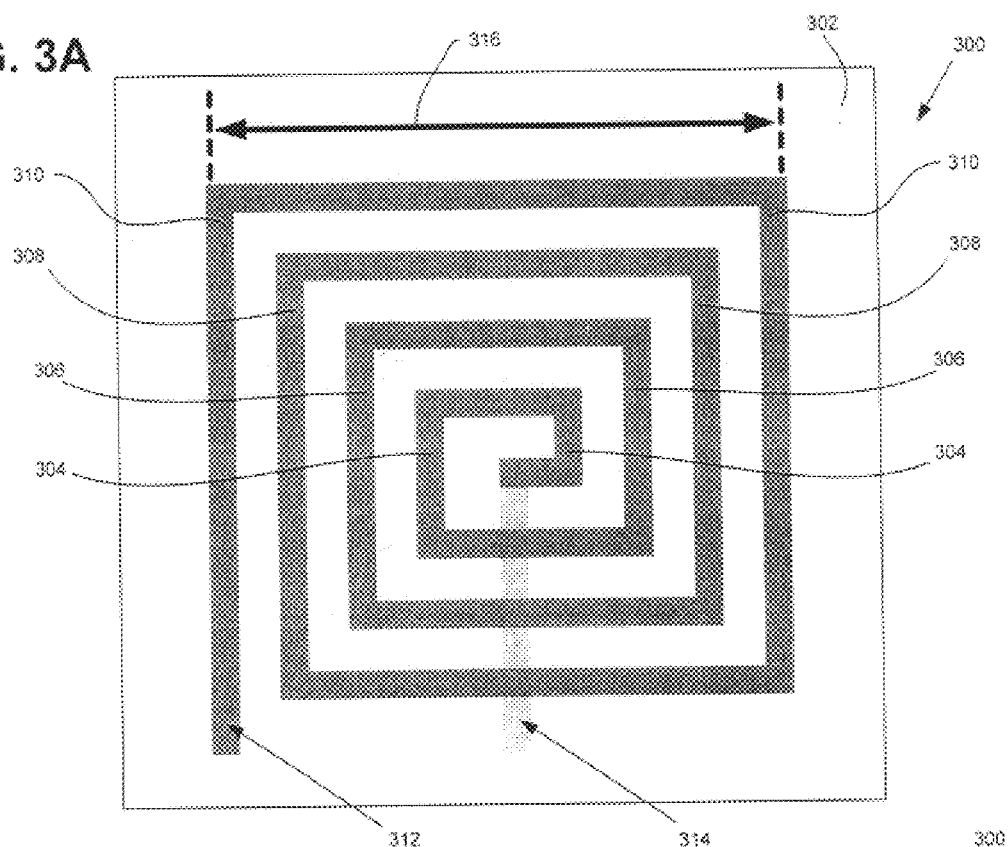
FIG. 3A illustrates a top view of the invention's inductor.

FIG. 3A shows a top view of the invention's inductor 300 in an area of a semiconductor chip. In this example, the inductor is configured as a "square spiral inductor." The four metal turns of inductor 300 are referred to by numerals 304, 306, 308, and 310. Metal turns 304, 306, 308, and 310 are patterned within dielectric 302 in a manner known in the art. Thus, the areas of dielectric 302 which are flanked by metal turns 304, 306, 308, and 310 are within the magnetic field that will be created by metal turns 304, 306, 308, and 310. Dielectric 302 can be silicon dioxide or low-k dielectrics.

Metal turns 304, 306, 308, and 310 can be aluminum, copper, or a copper-aluminum alloy.

Metal turns 304, 306, 308, and 310 are patterned on one metal layer. Metal turn 310 ends in connection terminal 312. Connection terminal 312 is thus a part of inductor 300 while also functioning as a first connection terminal of inductor 300. Connection terminal 314 is also a part of inductor 300 and functions as a second connection terminal of inductor 300. However, connection terminal 314 is patterned on a different metal layer of the chip than the rest of inductor 300 to allow connection terminal 314 to cross underneath metal turns 304, 306, 308 and 310 of inductor 300 without shorting the metal turns together. An electrical connection between connection terminal 314 and metal turn 304 of inductor 300 is then provided, for example, by a via. Connection terminal 314 is shown in a different shade to illustrate that it is situated on a different metal layer of the chip than the remainder of the metal used to fabricate inductor 300. The width of inductor 300 is referred to in FIG. 3A by numeral 316.

Figure 3B:
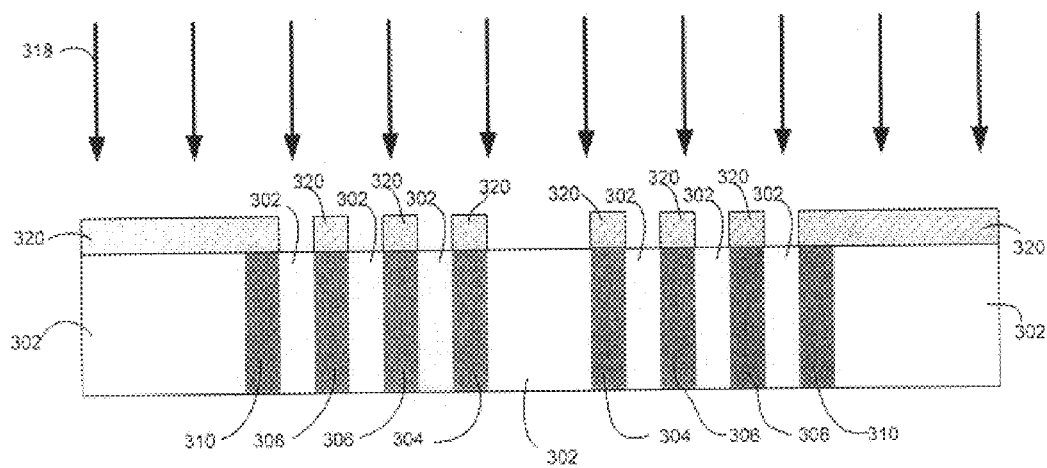
FIG. 3B illustrates a cross section view of the invention's inductor during a selective ion implantation step.

FIG. 3B shows a cross section view of inductor 300 during the selective ion implantation step. Metal segments 304, 306, 308, and 310 are segments of metal turns 304, 306, 308, and 310, respectively. Photoresist 320 is shown patterned over all of the chip except the areas of dielectric 302 between metal segments 304, 306, 308, and 310. Ions, referred to generally by numeral 318, are blocked by photoresist 320 from penetrating the protected areas of the chip. However, ions 318 penetrate the unprotected areas of dielectric 302 that will be within the electromagnetic field created by metal turns 304, 306, 308, and 310 of the inductor.

A post-implant anneal may then be performed to electrically activate or react the implanted ions and repair any damage prior to the deposition of a passivation layer on the chip.

As an alternative to the ion implantation step discussed above, ion sputtering can be used to introduce the atoms and/or molecules of high permeability materials into the dielectric material of the inductor. A target of high permeability material is placed in a vacuum chamber along with the chip and the target is grounded. In the present example, argon gas within the chamber is ionized to create positive ions of argon which are then attracted to the grounded target of the high permeability material. The argon ions collide with the target material and the collision causes atoms and/or molecules of the high permeability material to scatter from the target onto the chip's surface.

Ion sputtering can be utilized to implant alloys, such as nickel-iron alloys, in one step rather than implanting the individual ions of nickel and iron into the chip and then performing an additional process to reform the nickel-iron alloy on the chip. As the argon ions collide with the target of nickel-iron alloy, pieces of the nickel-iron alloy will break off and scatter from the target onto the surface of the chip. Thus, the nickel-iron alloy remains an alloy during the ion sputtering process and no additional process step is required to reform the alloy.

Whether ion implantation or ion sputtering techniques are used, the atoms and/or molecules of the high permeability material are deposited on or near the surface of the chip. The presence of these high permeability atoms and/or molecules in the dielectric material that will be within the electromagnetic field of the inductor's metal turns increases the permeability of the dielectric material. The higher permeability of the dielectric material results in a higher inductance, as can be seen from Equation 3. It is to be noted that FIGS. 2 and 3 depict a damascene (or in-laid) metal process. However, the invention applies equally well to a subtractive metal etching process.

Thus, the invention allows the device engineer to increase the inductance of an on-chip inductor by increasing the permeability of the dielectric material rather than by increasing the size of the on-chip inductor, which would require a larger area of the chip to be set aside for inductors. If very high permeability material such as a nickel-iron alloy is used, only a small amount of the alloy is required to be mixed in with the dielectric material to result in a significant increase in the permeability of the dielectric material and therefore a significant increase in the inductance.

Moreover, because the number of metal turns does not have to be increased to achieve a higher inductance value, there is no resulting increase in the resistance of the inductor and therefore no corresponding decrease in the quality factor of the on-chip inductor. Use of the invention's inductor will enable device engineers to include significantly more of the invention's inductors on a single chip, yielding significant advantages in circuit design and resulting in greater integration of passive components on a single chip.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, in one embodiment, instead of a blanket implantation or sputtering of high permeability material, only those chip areas in which an inductor is to be formed are subjected to the implantation or sputtering of the high permeability material. This embodiment differs from the embodiment explained in relation to FIGS. 3A and 3B since the metal turns are not masked and are thus exposed to the high permeability material. This exposure may result in a small increase in the resistance of the metal turns and thus a small increase in the resistance of the inductor. However, this small increase in the resistance of the inductor is acceptable in light of the significant increase in its inductance.

The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabrication of on-chip inductors and related structure have been described.

What is claimed is:

1. A method comprising steps of:
   covering a first semiconductor die area, said first semiconductor die area including a first dielectric area, said first dielectric area having a first permeability;
   interspersing a permeability conversion material in a second area of said semiconductor die, said second semiconductor die area including a second dielectric area, said permeability conversion material having a second permeability, said second permeability being higher than said first permeability.

2. The method of claim 1 wherein said covering step comprises covering said first semiconductor die area with photoresist.

3. The method of claim 1 wherein said first dielectric area comprises silicon dioxide.

4. The method of claim 1 wherein said first dielectric area comprises a low-k dielectric.

5. The method of claim 1 wherein said second dielectric area comprises silicon dioxide.

6. The method of claim 1 wherein said second dielectric area comprises a low-k dielectric.

7. The method of claim 1 wherein said permeability conversion material is selected from the group comprising of nickel, iron, nickel-iron alloy, and magnetic oxide.

8. The method of claim 1 wherein said step of interspersing is performed by implanting said permeability conversion material in said second area of said semiconductor die.

9. The method of claim 1 wherein said step of interspersing is performed by sputtering said permeability conversion material on said second area of said semiconductor die.

10. The method of claim 1 further comprising a step of patterning a conductor within said second dielectric area, said conductor forming an inductor.

11. The method of claim 10 wherein said conductor is selected from the group consisting of copper, aluminum, and copper-aluminum alloy.

12. The method of claim 10 wherein said conductor is patterned as a square spiral.

13. The method of claim 10 wherein said permeability conversion material is selected from the group comprising of nickel, iron, nickel-iron alloy, and magnetic oxide.

14. The method of claim 10 wherein said step of interspersing is performed by implanting said permeability conversion material in said second area of said semiconductor die.

15. The method of claim 10 wherein said step of interspersing is performed by sputtering said permeability conversion material on said second area of said semiconductor die.

16. A method comprising steps of:

patterning a conductor within a dielectric;

interspersing a permeability conversion material in said dielectric, wherein said permeability conversion material has a permeability greater than a permeability of said dielectric.

17. The method of claim 16 wherein said dielectric comprises silicon dioxide.

18. The method of claim 16 wherein said dielectric comprises a low-k dielectric.

19. The method of claim 16 wherein said permeability conversion material is selected from the group comprising of nickel, iron, nickel-iron alloy, and magnetic oxide.

20. The method of claim 16 wherein said step of interspersing is performed by implanting said permeability conversion material in said dielectric.

21. The method of claim 16 wherein said step of interspersing is performed by sputtering said permeability conversion material on said dielectric.

22. The method of claim 16 wherein said conductor is selected from the group consisting of copper, aluminum, and copper-aluminum alloy.

23. The method of claim 16 wherein said conductor is patterned as a square spiral.

* * * * *